(12) United States Patent  
Maegawa et al.

(10) Patent No.: US 11,242,617 B2  
(45) Date of Patent: Feb. 8, 2022

(54) METHOD FOR PRODUCING SILICON SINGLE CRYSTAL

(71) Applicant: SUMCO CORPORATION, Tokyo (JP)

(72) Inventors: Koichi Maegawa, Tokyo (JP); Yasuhito Narushima, Tokyo (JP); Yasufumi Kawakami, Tokyo (JP); Fukuo Ogawa, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/471,219

(22) PCT Filed: Oct. 30, 2017

(86) PCT No.: PCT/JP2017/039028  
§ 371 (c)(1),  
(2) Date: Jun. 19, 2019

(87) PCT Pub. No.: WO2018/116637  
PCT Pub. Date: Jun. 28, 2018

(65) Prior Publication Data  
US 2020/0087814 A1   Mar. 19, 2020

(30) Foreign Application Priority Data  
Dec. 20, 2016   (JP) .............................. JP2016-246519

(51) Int. Cl.  
*C30B 15/30*   (2006.01)  
*C30B 15/20*   (2006.01)  
*C30B 29/06*   (2006.01)  
*C30B 15/04*   (2006.01)

(52) U.S. Cl.  
CPC .............. *C30B 15/30* (2013.01); *C30B 15/04* (2013.01); *C30B 15/20* (2013.01); *C30B 29/06* (2013.01)

(58) Field of Classification Search  
CPC ......... C30B 29/06; C30B 15/04; C30B 15/20; C30B 15/30  
See application file for complete search history.

(56) References Cited

U.S. PATENT DOCUMENTS 5,779,791 A * 7/1998 Korb ...................... C30B 15/14  
                                              117/15  
6,019,836 A * 2/2000 Izumi ..................... C30B 15/22  
                                              117/13

(Continued)

FOREIGN PATENT DOCUMENTS

CN   104357901 A   2/2015  
CN   105040099 A   11/2015

(Continued)

OTHER PUBLICATIONS

International Search Report issued in International Patent Application No. PCT/JP2017/039028, dated Dec. 12, 2017.

(Continued)

*Primary Examiner* — Matthew J Song  
(74) *Attorney, Agent, or Firm* — Greenblum & Bernstein, P.L.C.

(57) ABSTRACT

A silicon single crystal production method includes pulling up and growing a silicon single crystal from silicon melt containing red phosphorus as a dopant by Czochralski process. The silicon single crystal is intended for a 200-mm-diameter wafer. The silicon single crystal includes a straight body with a diameter in a range from 201 mm to 230 mm. The straight body includes a straight-body start portion with an electrical resistivity in a range from 0.8 mΩcm to 1.2 mΩcm. A crystal rotation speed of the silicon single crystal is controlled to fall within a range from 17 rpm to 40 rpm for at least part of a shoulder-formation step for the silicon single crystal.

6 Claims, 5 Drawing Sheets

(56) References Cited

U.S. PATENT DOCUMENTS

Figure 1:
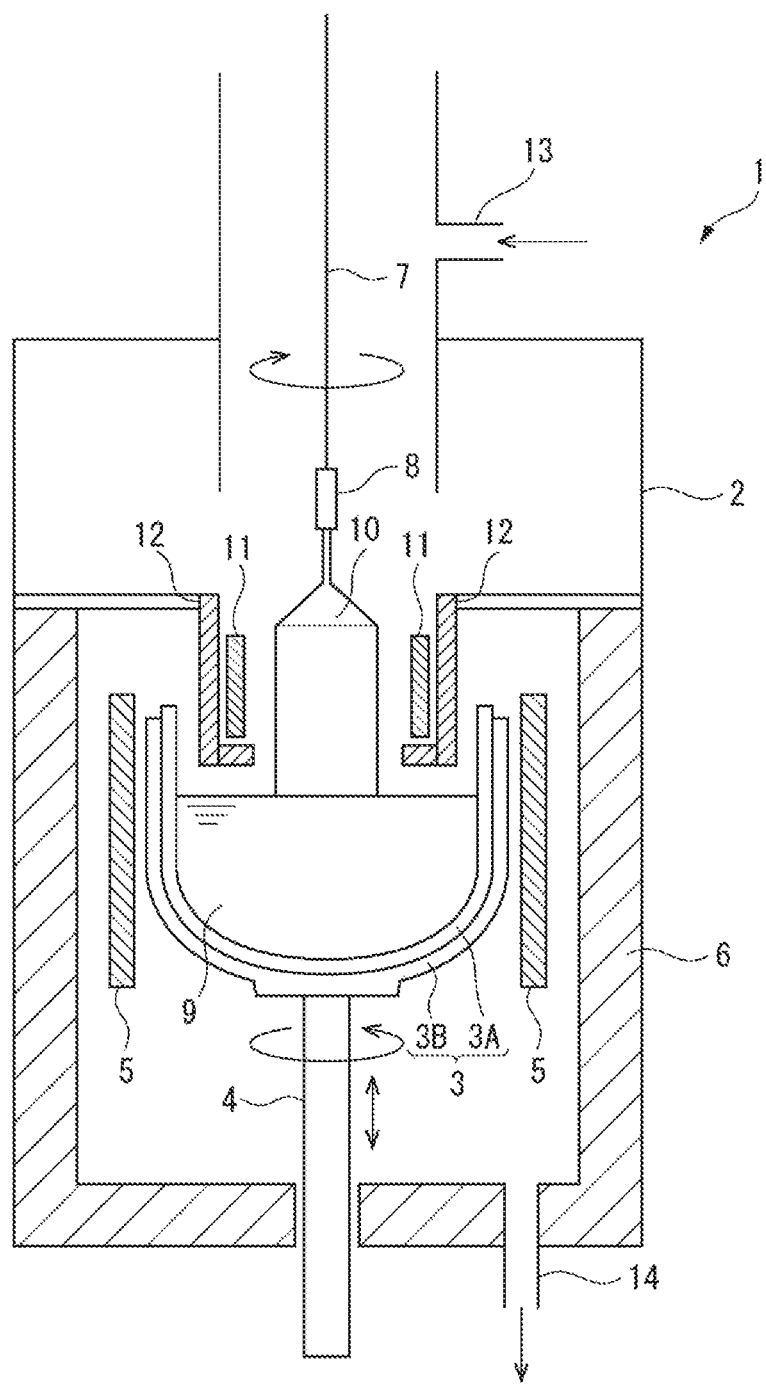

| | | | | |
|---|---|---|---|---|
| 2002/0000188 A1* | 1/2002 | Weber | ................... | C30B 29/06 |
| | | | | 117/13 |
| 2007/0105279 A1* | 5/2007 | Falster | ............... | H01L 21/3225 |
| | | | | 438/113 |
| 2015/0275392 A1* | 10/2015 | Soeta | ................... | C30B 29/06 |
| | | | | 117/19 |
| 2016/0237589 A1* | 8/2016 | Soeta | ................... | C30B 15/203 |
| 2018/0355509 A1* | 12/2018 | Samanta | ............... | C30B 29/06 |

FOREIGN PATENT DOCUMENTS

| | | |
|---|---|---|
| JP | 2002-128591 A | 5/2002 |
| JP | 2005-29400 A | 2/2005 |
| JP | 2010-265143 A | 11/2010 |
| JP | 2012-250859 | 12/2012 |
| JP | 2016-121032 A | 7/2016 |
| KR | 10-2006-0050317 A | 5/2006 |
| WO | 2009/025342 A1 | 2/2009 |
| WO | 2009/104534 A1 | 8/2009 |
| WO | WO 2016/103987 A1 | 6/2016 |

OTHER PUBLICATIONS

International Preliminary Report on Patentability (IPRP) for PCR/JP2017/039028, dated Jun. 25, 2019.

Office Action for CN App. No. 201780079175.8, dated Nov. 23, 2020 (w/ translation).

Notice of Allowance for KR App. No. 10-2019-7019170, dated Mar. 25, 2021 (w/ partial translation).

\* cited by examiner

METHOD FOR PRODUCING SILICON SINGLE CRYSTAL

TECHNICAL FIELD

The present invention relates to a silicon single crystal production method.

BACKGROUND ART

Portable electronics such as mobile phones have recently been widely used. Such portable electronics have been required to be usable while carried around for a long time, so that studies have been conducted on an increase in the capacity of a built-in battery for portable electronics and a reduction in the power consumption of portable electronics themselves.

A reduction in the power consumption of portable electronics themselves requires a reduction of the power consumption of semiconductor devices installed in the portable electronics.

For instance, a low voltage power MOSFET (Metal Oxide Semi Conductor Field Effect Transistor) is used as a power device for portable electronics that is configured to exhibit a predetermined resistance therein in response to current applied thereto, consuming an electric power by itself depending on the current flowing through the low voltage power MOSFET.

Thus, a reduction in the internal resistance exhibited when current is applied to the low voltage power MOSFET results in a reduction in the power consumption of portable electronics. Accordingly, to reduce a resistance exhibited when current is applied to the low voltage power MOSFET, an N-type silicon single crystal with a low resistivity has been strongly desired.

Meanwhile, in pulling up such an N-type silicon single crystal with a low resistivity, dislocations sometimes occur during the process of growing a crown (shoulder) from a neck of the silicon single crystal and, sequentially, growing a straight body.

In this regard, Patent Literature 1 discloses a technique to prevent the occurrence of dislocation, in which a crystal rotation speed and a crucible rotation speed for formation of the crown are controlled to improve an in-plane evenness of a dopant concentration in the crown.

CITATION LIST

Patent Literature(s)

Patent Literature 1 JP 2012-250859 A

SUMMARY OF THE INVENTION

Problem(s) to be Solved by the Invention

However, the technique disclosed in Patent Literature 1 is not sufficient for preventing occurrence of dislocation, since occurrence of dislocations in a straight-body start portion of the silicon single crystal is attributed not only to the unevenness of the dopant concentration but also sometimes to entry of foreign substances floating on a silicon melt into the straight-body start portion of the silicon single crystal and the vicinity thereof.

An object of the invention is to provide a silicon single crystal production method capable of preventing occurrence of dislocations in a silicon single crystal throughout a range from a shoulder start portion to a straight-body start portion.

Means for Solving the Problem(s)

The invention has been made based on the findings that a distance between a heat shield plate and an outer circumferential surface of a silicon single crystal becomes so large during formation of a predetermined section beginning with a shoulder-start portion of the silicon single crystal that a purge performance with gas (e.g., Ar gas) becomes too low to blow away foreign substances on a surface of silicon melt, thus causing dislocation. Specific contents of the invention are as follows.

According to an aspect of the invention, a silicon single crystal production method includes pulling up and growing a silicon single crystal from silicon melt containing red phosphorus as a dopant by Czochralski process. The silicon single crystal is intended for a 200-mm-diameter wafer, the silicon single crystal includes a straight body with a diameter in a range from 201 mm to 230 mm, the straight body includes a straight-body start portion with an electrical resistivity in a range from 0.8 mΩcm to 1.2 mΩm, and a crystal rotation speed of the silicon single crystal is controlled to fall within a range from 17 rpm to 40 rpm for at least part of a shoulder-formation step.

According to another aspect of the invention, a silicon single crystal production method includes pulling up and growing a silicon single crystal from silicon melt containing arsenic as a dopant by Czochralski process. The silicon single crystal is intended for a 200-mm-diameter wafer, the silicon single crystal includes a straight body with a diameter in a range from 201 mm to 230 mm, the straight body includes a straight-body start portion with an electrical resistivity in a range from 1.8 mΩcm to 3.0 mΩcm, and a crystal rotation speed of the silicon single crystal is controlled to fall within a range from 17 rpm to 40 rpm for at least part of a shoulder-formation step.

The above arrangements, where the crystal rotation speed of the silicon single crystal is controlled to fall within the range from 17 rpm to 40 rpm for at least part of the shoulder-formation step of the silicon single crystal, allow for causing a swirl (forced convection) in a direction away from the silicon single crystal on the surface of the silicon melt with the rotation of the silicon single crystal. The foreign substances floating on the surface of the silicon melt are thus forced outward by the swirl, preventing the silicon single crystal from being contaminated with the foreign substances and, consequently, preventing occurrence of dislocation.

In the above aspects, it is preferable that the crystal rotation speed of the silicon single crystal is controlled to fall within the range from 17 rpm to 40 rpm for when a diameter of the silicon single crystal is in a range from 20 mm to 190 mm during the shoulder-formation step.

Since dislocations are likely to occur during the shoulder-formation step when the diameter of the silicon single crystal is in a range from 20 mm to 190 mm, the crystal rotation speed of the silicon single crystal for this range is controlled to fall within a range from 17 rpm to 40 rpm. This arrangement thus desirably prevents occurrence of dislocation.

In the above aspects, it is preferable that the crystal rotation speed of the silicon single crystal is controlled to fall within the range from 17 rpm to 40 rpm for when a diameter of the silicon single crystal is in a range from 100 mm to 190 mm during the shoulder-formation step.

In the shoulder-formation step, the silicon single crystal can be grown without occurrence of dislocations even at a crystal rotation speed of less than 17 rpm as long as the crystal diameter is in a range of less than 100 mm. However, when the crystal diameter reaches a range of 100 mm or more, dislocations occur at a crystal rotation speed of less than 17 rpm. Accordingly, dislocations are effectively reduced by setting the crystal rotation speed to 17 rpm or more, especially, for when the crystal diameter of the silicon single crystal is in a range from 100 mm to 190 mm.

In the above aspects, it is preferable that the crystal rotation speed of the silicon single crystal is in a range from 3 rpm to 20 rpm at a position distant more than 80 mm from the straight-body start portion of the silicon single crystal.

When the crystal rotation speed for the above range falls below 3 rpm, oxygen distribution in a crystal plane becomes worse, possibly impairing the quality. Meanwhile, when the crystal rotation speed exceeds 20 rpm, crystal deformation would occur.

A temperature gradient around the silicon melt at a position distant more than 80 mm from the straight-body start portion is lower than a temperature gradient around the silicon melt at the time when the diameter of the silicon single crystal is in the range from 20 mm to 190 mm during the shoulder-formation step of the silicon single crystal, and is thus likely to be affected by the crystal rotation speed (i.e., crystal deformation is likely to occur).

It should be noted that crystal deformation means a shape anomaly with a lowered roundness of the crystal in a horizontal cross section. Occurrence of crystal deformation possibly results in impairing the quality of an outer periphery of a product in the form of a silicon wafer or in producing a wafer partly failing to have a desired diameter.

Further, since crystal deformation is affected by the crystal rotation speed as described above, an excessive increase in the crystal rotation speed causes crystal deformation. However, such crystal deformation can be prevented by lowering the crystal rotation speed to be a predetermined rotation speed or less.

The above arrangement, where the crystal rotation speed of the silicon single crystal is 20 rpm or less at a position distant more than 80 mm from the straight-body start portion of the silicon single crystal, thus prevents occurrence of crystal deformation.

In the above aspects, it is preferable that the silicon single crystal is pulled up by a pull-up apparatus with a wire, and the crystal rotation speed of the silicon single crystal is set so that the crystal rotation speed does not fall within a range of a resonance rotation speed for the wire of the pull-up apparatus. It is particularly preferable that the crystal rotation speed of the silicon single crystal is set less than 14 rpm for a neck-formation step.

In pulling up silicon single crystal by the pull-up apparatus with a wire, the wire is likely to swing due to resonance phenomenon at a crystal rotation speed in a range from 14 rpm to 16 rpm during the neck-formation step. Accordingly, a crystal rotation speed is preferably determined not to be the resonance rotation speed.

It should be noted that a higher rotation speed usually tends to cause a large swing of the wire, even though the rotation speed is set to 16 rpm to prevent occurrence of resonance phenomenon. Accordingly, the crystal rotation speed of the silicon single crystal for the neck-formation step is set less than 14 rpm to prevent the wire from swinging for stable formation of the neck.

BRIEF DESCRIPTION OF DRAWING(S)

FIG. 1 schematically shows a configuration of a pull-up apparatus according to an exemplary embodiment of the invention.

Figure 2:
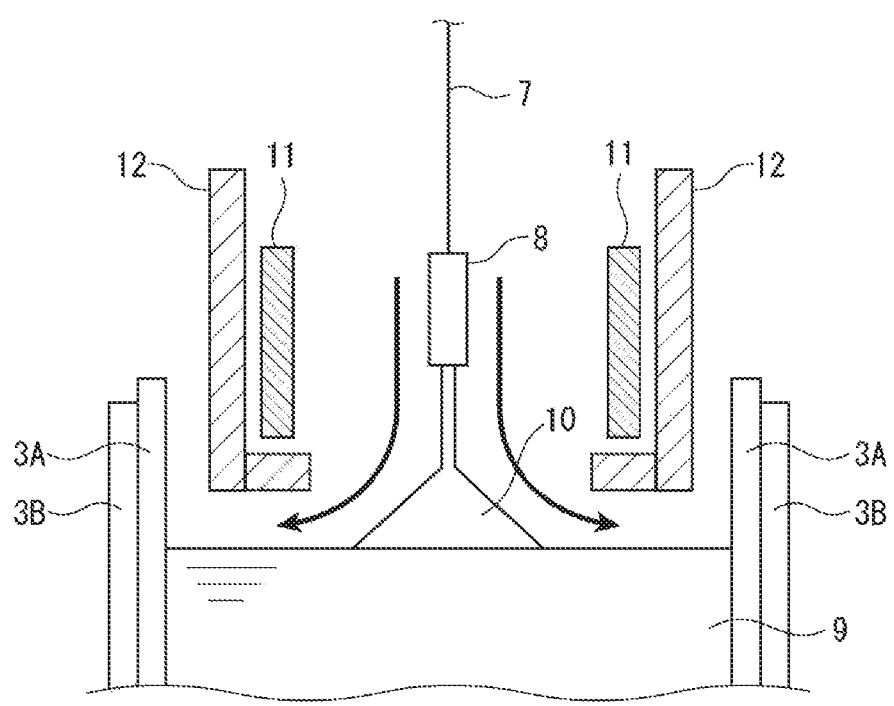

FIG. 2 schematically shows an operation according to the exemplary embodiment.

Figure 3:
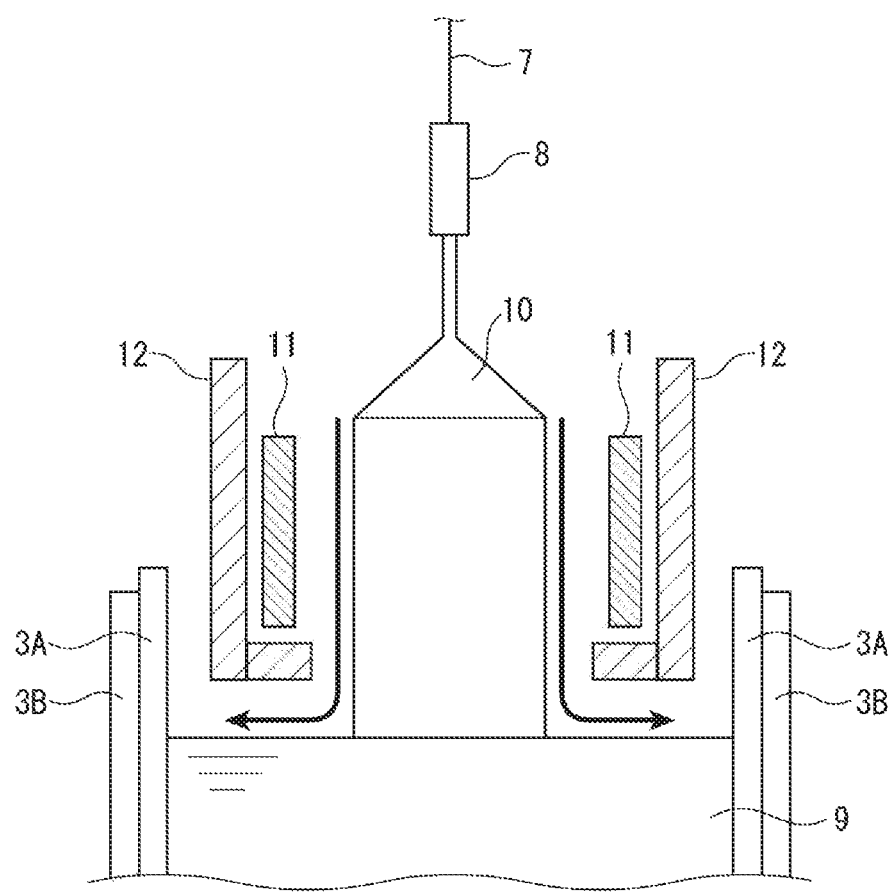

FIG. 3 schematically shows the operation according to the exemplary embodiment.

Figure 4:
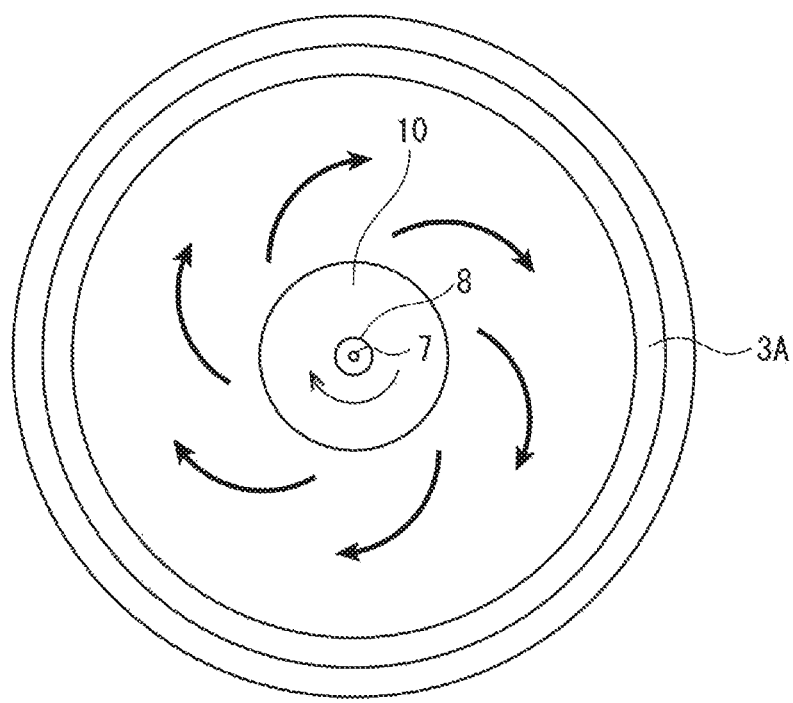

FIG. 4 schematically shows the operation according to the exemplary embodiment.

Figure 5:
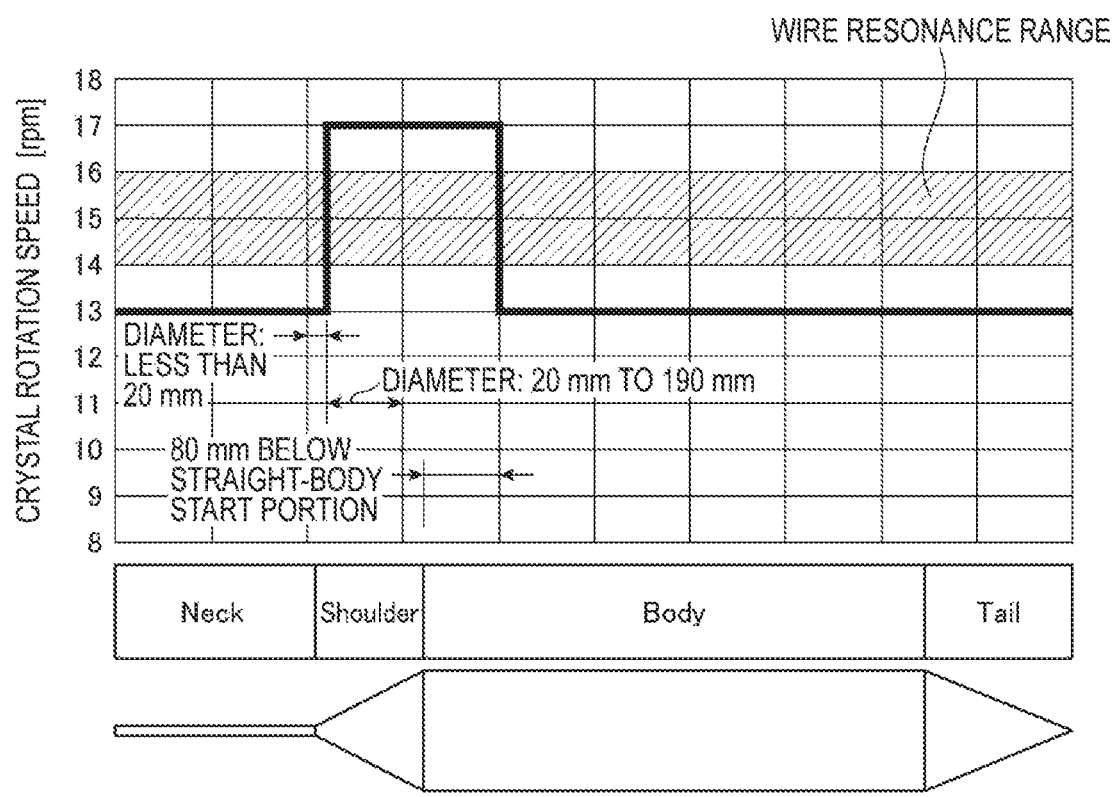

FIG. 5 schematically shows crystal rotation speeds for positions in the silicon single crystal according to the exemplary embodiment.

DESCRIPTION OF EMBODIMENT(S)

[1] Configuration of Silicon Single Crystal Pull-Up Apparatus 1

FIG. 1 schematically shows a configuration of a silicon single crystal pull-up apparatus 1, where a silicon single crystal production method according to an exemplary embodiment of the invention is applicable. The pull-up apparatus 1, which is configured to pull up a silicon single crystal 10 by Czochralski process, includes a chamber 2 defining an outer shell of the apparatus and a crucible 3 located at a center of the chamber 2.

The crucible 3, which has a two-layered structure of an inner quartz crucible 3A and an outer graphite crucible 3B, is fixed to an upper end of a rotatable and vertically movable support shaft 4.

A resistive heater 5 is located at the outside of the crucible 3 surrounding the crucible 3 and a heat insulation material 6 is located at the outside of the heater 5 along an inner surface of the chamber 2.

A wire 7 is located above the crucible 3. The wire 7 is configured to rotate at a predetermined speed coaxially with the support shaft 4 in the opposite or same direction. A seed crystal 8 is attached to a lower end of the wire 7.

A cooler 11 is located in the chamber 2. The cooler 11 is a cylindrical cooling device surrounding a silicon single crystal 10, which is being currently grown above a silicon melt 9 in the crucible 3.

The cooler 11 is made of, for instance, a metal with excellent thermal conductivity (e.g., copper) and configured to be forcibly cooled by coolant flowing through the cooler 11. The cooler 11 serves to promote cooling of the currently grown silicon single crystal 10 to control a temperature gradient in a direction along the wire 7 at a center of the single crystal and a periphery of the single crystal.

Further, a cylindrical heat shield plate 12 is located covering outer circumferential surface and lower end surface of the cooler 11.

The heat shield plate 12 serves to: insulate the currently grown silicon single crystal 10 from high-temperature radiant heat from the silicon melt 9 in the crucible 3, the heater 5 and a side wall of the crucible 3; and reduce diffusion of heat to the cooler 11 with a low temperature near a solid-liquid interface, or a crystal-growth interface, for the control of the temperature gradient in the direction along the pulling shaft at the center of the single crystal and the periphery of the single crystal in conjunction with the cooler 11.

An upper portion of the chamber 2 is provided with a gas inlet 13 for introducing inert gas, such as Ar gas, into the chamber 2. A lower portion of the chamber 2 is provided with an exhaust outlet 14 for exhausting gas in the chamber 2 drawn by driving a vacuum pump (not shown).

The inert gas introduced into the chamber 2 through the gas inlet 13 flows downward between the currently grown silicon single crystal 10 and the cooler 11 and passes through a space (liquid surface Gap) between the lower end of the heat shield plate 12 and a liquid surface of the silicon melt 9. The inert gas then flows toward the outside of the heat shield plate 12 and the outside of the crucible 3 and flows downward at the outside of the crucible 3 to be exhausted through the exhaust outlet 14.

In growing the silicon single crystal 10 with the use of the above growing apparatus, the silicon melt 9 is formed by melting a solid material (e.g., polycrystalline silicon) charged in the crucible 3 by heating with the heater 5 while a pressure-reduced inert gas atmosphere is maintained in the chamber 2. When the silicon melt 9 is formed in the crucible 3, the wire 7 is moved downward so that the seed crystal 8 is immersed in the silicon melt 9. The wire 7 is then gradually pulled up while rotating the crucible 3 and the wire 7 in a predetermined direction, thereby growing the silicon single crystal 10 continuously from the seed crystal 8.

[2] Mechanism of Occurrence of Dislocations in Silicon Single Crystal 10 and Method to Avoid Occurrence of Dislocations At an initial stage of pulling up the silicon single crystal 10 with a straight-body diameter ranging from 201 mm to 230 mm, a space between the heat shield plate 12 and a shoulder of the silicon single crystal 10 is relatively large as shown in FIG. 2. In this state, even when gas (e.g., Ar gas) is purged from above, a flow rate of the gas flowing between the heat shield plate 12 and the silicon single crystal 10 inevitably becomes low. Thus, foreign substances or the like floating on the surface of the silicon melt 9 are likely to come close to the silicon single crystal 10 and adhesion of the foreign substances to the silicon single crystal 10 causes dislocations at an adhered part and, consequently, in the vicinity thereof.

Meanwhile, when the silicon single crystal 10 is further pulled up to form a straight body, the space between the heat shield plate 12 and the silicon single crystal 10 becomes relatively small as shown in FIG. 3. Thus, the foreign substances floating on the surface of the silicon melt 9 can be blown away from the silicon single crystal 10 toward an inner circumferential surface of the quartz crucible 3A with the flow rate of the purged gas, thereby reducing the possibility of occurrence of dislocations in the silicon single crystal 10.

In this regard, the foreign substances on the surface of the silicon melt 9 are supposed to include red phosphorus or arsenic, since red phosphorus or arsenic, which is added as a dopant for a pull-up operation of the silicon single crystal 10 with a low electrical resistivity (hereinafter referred to as resistivity), would be evaporated during the pull-up operation and recrystallized on, for instance, a furnace wall to fall down and float on the surface of the silicon melt 9. An evaporation rate of red phosphorus or arsenic (dopant) positively correlates with the concentration of the dopant in the silicon melt 9. Specifically, the evaporation rate increases with an increase of the concentration.

Thus, when red phosphorus is contained as a dopant and a straight-body start portion of the silicon single crystal 10 has a resistivity of 1.2 mΩcm or less, or when arsenic is contained as a dopant and the straight-body start portion of the silicon single crystal 10 has a resistivity of 3.0 mΩcm or less, such a considerably high concentration of the dopant in the silicon melt 9 causes intensive evaporation of the dopant with more foreign substances falling down and floating on the surface of the silicon melt 9 as compared with a typical low concentration. Dislocations are thus more likely to occur in the silicon single crystal 10.

Accordingly, in the exemplary embodiment, a crystal rotation speed of the silicon single crystal 10 at the initial stage of pulling up the silicon single crystal 10 shown in FIG. 2 is increased as shown in FIG. 4, causing a swirl of forced convection on the surface of the silicon melt 9 so that the foreign substances floating on the surface of the silicon melt 9 is forced away from the silicon single crystal 10 to prevent adhesion of the foreign substances on the surface of the silicon single crystal 10.

Specifically, as shown in FIG. 5, the crystal rotation speed is set to 17 rpm or more for when the diameter of the silicon single crystal 10 is in a range from 20 mm to 190 mm during a shoulder-formation step, set to 20 rpm or less at a position distant more than 80 mm from the straight-body start portion, and controlled to be less than 14 rpm during a neck-formation step. It should be noted that the crystal rotation speed is preferably set to 17 rpm or more, especially, for when the diameter of the silicon single crystal 10 is in a range of 100 mm to 190 mm as described above.

Assuming that the pull-up apparatus 1 including the wire 7 has a pendulum whose weight is a seed chuck on the wire 7 and the silicon single crystal 10, a resonance rotation speed n of the wire 7 is calculated by the following equation (1), where g (g) denotes a total weight of the seed chuck and the silicon single crystal 10 and L (cm) denotes a distance from a pivot of the pendulum to a centroid thereof.

$$n=60/(2\pi \times \sqrt{(g/L)}) \tag{1}$$

When the above calculation is applied to the pull-up apparatus 1 and the silicon single crystal 10 with a typical straight-body diameter of 210 mm, the resonance rotation speed is calculated to be in a range from 14 rpm to 16 rpm. Rotation of the silicon single crystal 10 at a crystal rotation speed in the above range causes resonance in the silicon single crystal 10, so that the crystal rotation speed has to be within a range excluding such resonance rotation speeds, i.e., at least a speed of less than 14 rpm or more than 16 rpm, throughout the neck-formation step, shoulder-formation step, and straight-body-formation step. In the exemplary embodiment, the crystal rotation speed is thus set to 13 rpm to prevent occurrence of resonance at the initial stage of the pull-up operation.

Meanwhile, the crystal rotation speed of the silicon single crystal 10 is set again to 13 rpm for a range of more than 190 mm of the diameter of the silicon single crystal 10. This is because the temperature gradient of the silicon melt 9 around the crystal decreases during pull-up of the silicon single crystal 10 for formation of the straight body as compared with the range of 20 mm to 190 mm of the silicon single crystal diameter for the shoulder-formation step of the silicon single crystal 10, causing crystal deformation if the crystal rotation speed remains high.

Accordingly, the crystal rotation speed is set again to 13 rpm for the range of more than 190 mm. It should be noted that the crystal rotation speed is preferably changed between 13 rpm and 17 rpm in 10 seconds or less to minimize a time when the silicon single crystal 10 is rotated at a speed in the range from 14 rpm to 16 rpm.

Example(s)

Next, Examples of the invention will be described. It should be noted that the invention is by no means limited to Examples below.

[1] Dopant: Red Phosphorus

Using red phosphorus as a dopant to set a resistivity of the straight-body start portion to 0.8 mΩcm, the silicon single crystal 10 with a diameter of 210 mm for a 200-mm-diameter wafer was pulled up at six levels of crystal rotation speed. The results are shown in Table 1 below.

At a crystal rotation speed of less than 17 rpm among the six levels of crystal rotation speed, the silicon single crystal 10 is difficult to pull up without occurrence of dislocations during the shoulder-formation step. It has been found that the crystal rotation speed needs to be 17 rpm or more to increase a success rate in eliminating dislocations during the shoulder-formation step to 50% or more.

In the shoulder-formation step, the silicon single crystal 10 can be grown without occurrence of dislocations at a crystal rotation speed of less than 17 rpm (i.e., 15 rpm) as long as the crystal diameter is in a range of less than 100 mm. However, when the crystal diameter reaches a range of 100 mm or more, dislocations occur. Accordingly, dislocations are effectively reduced by setting the crystal rotation speed to 17 rpm or more, especially, for a crystal diameter range of 100 mm or more.

The shoulder can be formed without any problem at a crystal rotation speed for shoulder formation of 40 rpm. However, since a typical specification limit of the pull-up apparatus 1 is 40 rpm, a change in specification to enable a higher rotation at a speed of more than 40 rpm requires reinforcement of a drive system with increased equipment costs. Accordingly, an upper limit of the crystal rotation speed for shoulder formation is preferably 40 rpm.

A lower limit of the crystal rotation speed for formation of the straight body is 3 rpm and an upper limit is 20 rpm. At a speed of less than 3 rpm, oxygen distribution in a crystal plane becomes worse. At a speed exceeding 20 rpm, the straight body has crystal deformation.

It should be noted that although the diameter of the silicon single crystal 10 usually becomes larger during the shoulder-formation step, the process is to be shifted to the straight-body-formation step when the diameter of the silicon single crystal 10 reaches 190 mm or more.

Next, the silicon single crystal 10 was pulled up at a variety of crystal rotation speeds with red phosphorus used as a dopant. The results are shown in Table 2. It should be noted that the success rate in eliminating dislocations means a percentage of the number of samples of the silicon single crystal 10 having been successfully pulled up without occurrence of dislocations with respect to the total number of the samples of the silicon single crystal 10 having been pulled up.

TABLE 1

| | | 8 rpm | 13 rpm | 15 rpm | 17 rpm | 20 rpm | 34 rpm | 40 rpm |
|---|---|---|---|---|---|---|---|---|
| Number of crystals with dislocations in their shoulders | Dislocations position: diameter of 0 mm to 20 mm | 0 | 0 | 0 | 0 | 0 | 0 | 0 |
| | Dislocations position: diameter of 20 mm to 50 mm | 6 | 4 | 0 | 0 | 0 | 0 | 0 |
| | Dislocations position: diameter of 50 mm to 100 mm | 0 | 1 | 0 | 0 | 0 | 0 | 0 |
| | Dislocations position: diameter of 100 mm to 150 mm | 0 | 1 | 3 | 0 | 0 | 0 | 0 |
| | Dislocations position: diameter of 150 mm to 205 mm | 0 | 0 | 2 | 0 | 0 | 0 | 0 |
| Number of crystals with deformation in their straight bodies | | Formation of straight body not reached | Formation of straight body not reached | 0 | 0 | 0 | 3 | 3 |
| Number of crystals without either shoulder dislocations or straight-body deformation | | 0 | 0 | 1 | 16 | 3 | 0 | 0 |
| Total number of trials | | 6 | 6 | 6 | 16 | 3 | 3 | 3 |

TABLE 2

| | Ex. 1 | Ex. 2 | Comp. 1 | Comp. 2 | Comp. 3 | Comp. 4 |
|---|---|---|---|---|---|---|
| Diameter of straight body (mm) | 210 | 210 | 210 | 210 | 210 | 210 |
| Dopant | red phosphorus | red phosphorus | red phosphorus | red phosphorus | red phosphorus | red phosphorus |
| Resistivity of straight body start portion (m Ω cm) | 0.8 | 1.2 | 0.8 | 1.2 | 1.2 | 1.2 |
| From start of neck to shoulder diameter of 20 mm (rpm) | 13 | 13 | 13 | 13 | 13 | 17 |
| From shoulder diameter of 20 mm to position 80 mm below straight body start portion (rpm) | 17 | 17 | 13 | 13 | 22 | — |
| From position distant more than 80 mm below straight body start portion to end of tail (rpm) | 13 | 13 | 13 | 13 | 22 | — |

TABLE 2-continued

|  | Ex. 1 | Ex. 2 | Comp. 1 | Comp. 2 | Comp. 3 | Comp. 4 |
|---|---|---|---|---|---|---|
| Success rate in eliminating dislocations (%) | 50 | 90 | 0 | 60 | 0 | 0 |
| Number of crystals successful in eliminating dislocations | 8 | 18 | 0 | 6 | 0 | 0 |
| Total number of pulled up crystals | 16 | 20 | 5 | 10 | 2 | 2 |

By comparing Example 1 and Comparative 1, in both of which the straight-body start portion of the silicon single crystal 10 had a resistivity of 0.8 mΩcm, it has been found that Example 1, where the crystal rotation speed was set to 17 rpm for the growth from the straight-body start portion to a position distant by 80 mm below the straight-body start portion, had a considerably improved success rate in eliminating dislocations (i.e., 0% to 50%) as compared with Comparative 1, where a crystal rotation speed of 13 rpm was kept.

Likewise, by comparing Example 2 and Comparative 2, it has been found that the success rate in eliminating dislocations of Example 2 was improved from 60% to 90%, proving an advantage of changing the crystal rotation speed to 17 rpm.

In contrast, when the crystal rotation speed was set to 22 rpm as in Comparative 3, the shoulder was formed without any problem but crystal deformation occurred after the start of the formation of the straight body, causing dislocations at a position distant by 100 mm below the straight-body start portion.

In Comparative 4, the pull-up operation for the formation of the neck was performed at a crystal rotation speed of 17 rpm without changing the crystal rotation speed since the start of the neck formation. However, stabilization of the diameter was difficult to achieve due to a swing of the wire 7, so that the neck-formation step could not be shifted to the shoulder-formation step.

In view of the above, for the pull-up operation of the 210-mm-diameter silicon single crystal 10 under the conditions where the resistivity of the straight-body start portion is in a range from 0.8 mΩcm to 1.2 mΩcm and the dopant is red phosphorus, it has been demonstrated that the success rate in eliminating dislocations is improved by setting the crystal rotation speed to 17 rpm or more for when the diameter of the silicon single crystal 10 is in the range of 20 mm to 190 mm during the shoulder-formation step.

[2] Dopant: Arsenic

Further, using arsenic as a dopant, the pull-up operation was performed with a variety of crystal rotation speeds for when the diameter of the silicon single crystal 10 is in the range from 20 mm to 190 mm during the shoulder-formation step in the same manner as in the instance of using red phosphorus as the dopant. The results are shown in Table 3.

TABLE 3

|  | Ex. 3 | Ex. 4 | Comp. 5 | Comp. 6 |
|---|---|---|---|---|
| Diameter of straight body (mm) | 210 | 210 | 210 | 210 |
| Dopant | Arsenic | Arsenic | Arsenic | Arsenic |
| Resistivity of straight body start portion (mΩcm) | 1.8 | 3.0 | 1.8 | 3.0 |
| From start of neck to shoulder diameter of 20 mm (rpm) | 13 | 13 | 13 | 13 |
| From shoulder diameter of 20 mm to position 80 mm below straight body start portion (rpm) | 17 | 17 | 13 | 13 |
| From position distant more than 80 mm below straight body start portion to end of tail (rpm) | 13 | 13 | 13 | 13 |
| Success rate in eliminating dislocations (%) | 60 | 90 | 50 | 70 |
| Number of crystals successful in eliminating dislocations | 6 | 9 | 10 | 14 |
| Total number of pulled up crystals | 10 | 10 | 20 | 20 |

When the dopant was arsenic, the stability of the neck-formation step is dependent on swing of the wire 7. The dopant species is irrelevant to swing of the wire 7.

Dislocations are supposed to occur during the shoulder-formation step by the same mechanism as described above in the instance of using red phosphorus as the dopant. As shown in Table 3, it has been demonstrated that the elimination rate of dislocations is improved in the same manner as in the instance of using red phosphorus as the dopant.

Deformation of the straight body is relevant to the temperature gradient, not to the dopant species. Thus, the upper and lower limits of the crystal rotation speed for each step are the same as ones for the instance of using red phosphorus.

Similarly to the instance of using red phosphorus, by comparing Example 3 and Comparative 5, in both of which the resistivity of straight-body start portion was also 1.8 mΩcm, it has been found that the success rate in eliminating dislocations was improved from 50% to 60%.

Additionally, by comparing Example 4 and Comparative 6, in both of which the resistivity of the straight-body start portion was the same value (i.e., 3.0 mΩcm), it has been found that the success rate in eliminating dislocations was improved from 70% to 90%.

In view of the above, it has been demonstrated that in the instance of using arsenic as the dopant, the success rate in eliminating dislocations is also improved by setting the crystal rotation speed to 17 rpm or more for when the diameter of the silicon single crystal 10 is in the range from 20 mm to 190 mm during the shoulder-formation step.

EXPLANATION OF CODE(S)

1 . . . pull-up apparatus, 2 . . . chamber, 3 . . . crucible, 3A . . . quartz crucible, 3B . . . graphite crucible, 4 . . . support shaft, 5 . . . heater, 6 . . . heat insulation material, 7 . . . wire, 8 . . . seed crystal, 9 . . . silicon melt, 10 . . . silicon single crystal, 11 . . . cooler, 12 . . . heat shield plate, 13 . . . gas inlet, 14 . . . exhaust outlet

The invention claimed is:

1. A silicon single crystal production method comprising pulling up and growing a silicon single crystal from silicon melt comprising red phosphorus as a dopant by Czochralski process, while flowing gas downward between the silicon single crystal and a heat shield plate, wherein
the silicon single crystal is pulled up by a pull-up apparatus comprising a wire,
the silicon single crystal is intended for a 200-mm-diameter wafer,
the silicon single crystal comprises a straight body with a diameter in a range from 201 mm to 230 mm, the straight body comprising a straight-body start portion with an electrical resistivity in a range from 0.8 mΩcm to 1.2 mΩcm,
a crystal rotation speed of the silicon single crystal is controlled to fall within a range from 17 rpm to 40 rpm for at least part of a shoulder-formation,
the crystal rotation speed of the silicon single crystal is set to 13 rpm or less for a neck-formation,
the crystal rotation speed of the silicon single crystal is controlled to be in a range from 3 rpm to 13 rpm during formation of the straight body upon and after reaching a straight-body length of 80 mm from the straight-body start portion of the silicon single crystal, and is set so that the crystal rotation speed does not fall within a range of a resonance rotation speed for the wire of the pull-up apparatus, and
the crystal rotation speed of the silicon single crystal is changed between 13 rpm and 17 rpm in 10 seconds or less.

2. A silicon single crystal production method comprising pulling up and growing a silicon single crystal from silicon melt comprising arsenic as a dopant by Czochralski process, while flowing gas downward between the silicon single crystal and a heat shield plate, wherein
the silicon single crystal is pulled up by a pull-up apparatus comprising a wire,
the silicon single crystal is intended for a 200-mm-diameter wafer,
the silicon single crystal comprises a straight body with a diameter in a range from 201 mm to 230 mm, the straight body comprising a straight-body start portion with an electrical resistivity in a range from 1.8 mΩcm to 3.0 mΩcm,
a crystal rotation speed of the silicon single crystal is controlled to fall within a range from 17 rpm to 40 rpm for at least part of a shoulder-formation,
the crystal rotation speed of the silicon single crystal is set to 13 rpm or less for a neck-formation,
the crystal rotation speed of the silicon single crystal is controlled to be in a range from 3 rpm to 13 rpm during formation of the straight body upon and after reaching a straight-body length of 80 mm from the straight-body start portion of the silicon single crystal, and is set so that the crystal rotation speed does not fall within a range of a resonance rotation speed for the wire of the pull-up apparatus, and
the crystal rotation speed of the silicon single crystal is changed between 13 rpm and 17 rpm in 10 seconds or less.

3. The silicon single crystal production method according to claim 1, wherein the crystal rotation speed of the silicon single crystal is controlled to fall within the range from 17 rpm to 40 rpm for when a diameter of the silicon single crystal is in a range from 100 mm 190 mm during the shoulder-formation.

4. The silicon single crystal production method according to claim 1, wherein the crystal rotation speed of the silicon single crystal is controlled to fall within the range from 17 rpm to 40 rpm for when a diameter of the silicon single crystal is in a range from 20 mm to 190 mm during the shoulder-formation.

5. The silicon single crystal production method according to claim 2, wherein the crystal rotation speed of the silicon single crystal is controlled to fall within the range from 17 rpm to 40 rpm for when a diameter of the silicon single: crystal is in a range from 100 mm to 190 mm during the shoulder-formation.

6. The silicon single crystal production method according to claim 2, wherein the crystal rotation speed of the silicon single crystal is controlled to fall within the range from 17 rpm to 40 rpm for when a diameter of the silicon single crystal is in a range from 20 mm to 190 mm during the shoulder-formation.

* * * * *

UNITED STATES PATENT AND TRADEMARK OFFICE
CERTIFICATE OF CORRECTION

| | | |
|---|---|---|
| PATENT NO. | : 11,242,617 B2 | |
| APPLICATION NO. | : 16/471219 | |
| DATED | : February 8, 2022 | |
| INVENTOR(S) | : K. Maegawa et al. | |

It is certified that error appears in the above-identified patent and that said Letters Patent is hereby corrected as shown below:

In the Claims

Column 12, Line 23 (Claim 3, Line 5) please change "mm 190" to -- mm to 190 --
Column 12, Line 34 (Claim 5, Line 4) please change "single:" to -- single --

Signed and Sealed this
Twenty-third Day of August, 2022

*Katherine Kelly Vidal*
Katherine Kelly Vidal
*Director of the United States Patent and Trademark Office*